United States Patent
Simon

[19]

[11] Patent Number: 5,856,646
[45] Date of Patent: Jan. 5, 1999

[54] ERGONOMIC PALM OPERATED SOFT TOUCH CONTROL WITH MULTI-PLANE SENSING PADS

[75] Inventor: Barry S. Simon, Germantown, Wis.

[73] Assignee: Allen-Bradley Company, LLC, Milwaukee, Wis.

[21] Appl. No.: 781,788

[22] Filed: Jan. 9, 1997

[51] Int. Cl.$^6$ .................................................. H03K 17/975
[52] U.S. Cl. ........................................................... 200/600
[58] Field of Search ..................... 200/600; 192/129 R, 192/129 A; 307/116, 326, 328

[56] References Cited

U.S. PATENT DOCUMENTS

| | | | |
|---|---|---|---|
| 4,412,268 | 10/1983 | Dassow | 361/181 |
| 4,531,287 | 7/1985 | Shibata et al. | 30/43.6 |
| 5,153,572 | 10/1992 | Caldwell et al. | . |
| 5,164,901 | 11/1992 | Blackburn et al. | 364/424.05 |
| 5,189,417 | 2/1993 | Caldwell et al. | . |
| 5,235,217 | 8/1993 | Kirton | 307/326 |
| 5,239,152 | 8/1993 | Caldwell et al. | . |
| 5,341,036 | 8/1994 | Wheeler et al. | 307/328 |
| 5,396,222 | 3/1995 | Markus et al. | 340/679 |
| 5,512,205 | 4/1996 | Caldwell et al. | . |

OTHER PUBLICATIONS

TouchSensor Technologies, LLC. Undated.

*Primary Examiner*—Wynn Wood Coggins
*Assistant Examiner*—Michael J. Hayes
*Attorney, Agent, or Firm*—David G. Luettgen; John M. Miller; John J. Horn

[57] ABSTRACT

A soft touch switch comprises a switch housing, a first soft touch sensor, and a second soft touch sensor. The switch housing has an outer surface which is curved and an inner surface. The first sensor is disposed inside the switch housing adjacent a first portion of the inner surface, and the second sensor is disposed inside the switch housing adjacent a second portion of the inner surface. The first and second sensors are disposed in different planes inside the switch housing. The soft touch switch is especially suited for industrial applications such as punch presses and has enhanced safety, ergonomic, and freedom of installation features.

22 Claims, 2 Drawing Sheets

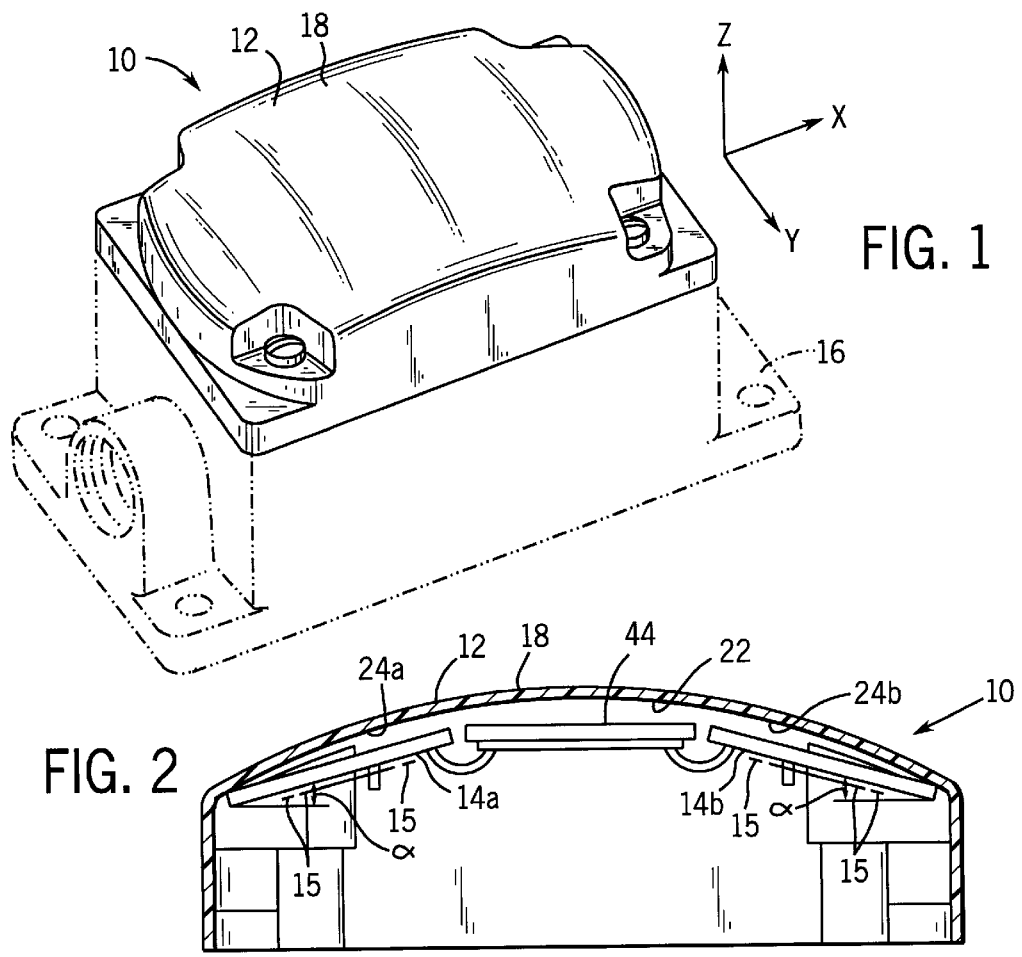
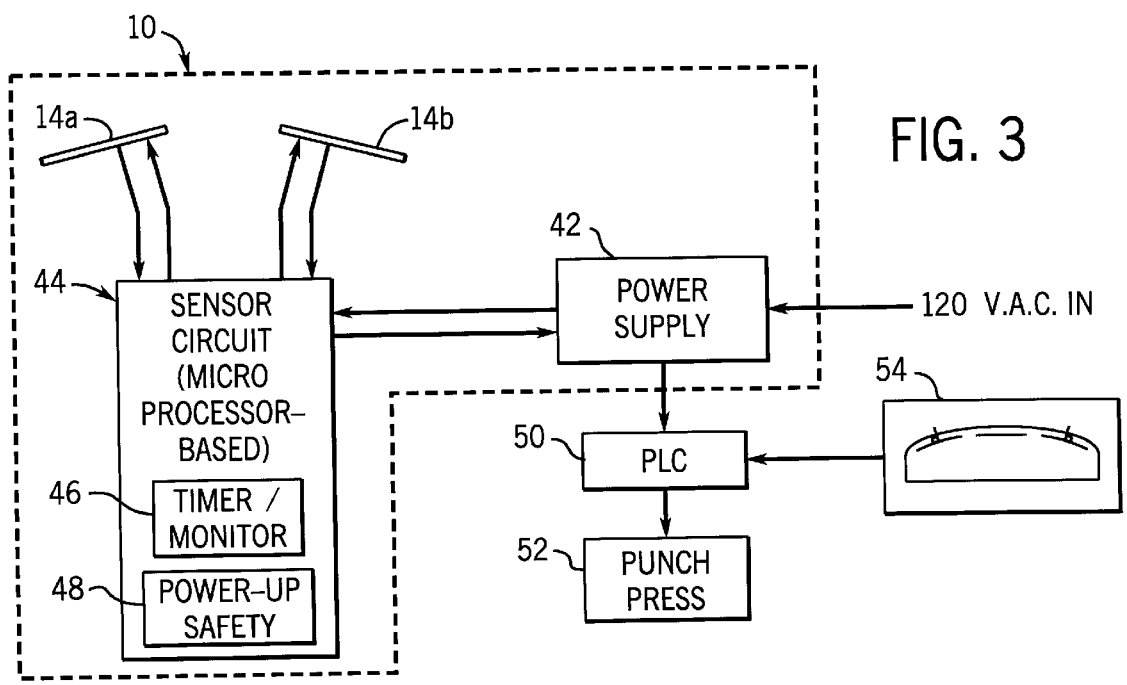

5,856,646

ERGONOMIC PALM OPERATED SOFT TOUCH CONTROL WITH MULTI-PLANE SENSING PADS

FIELD OF THE INVENTION

This invention relates to push button-type control devices for industrial machinery, and more specifically relates to an ergonomic soft touch control device having sensing pads in multiple planes.

DESCRIPTION OF RELATED ART

Heavy emphasis has been placed in recent years on developing work place environments which are not detrimental to the health and safety of employees. Since the tools and machines used by employees form part of their work place environment, this emphasis has included an emphasis on designing tools which are both safe and ergonomically correct.

Punch presses are a typical example of this trend. A punch press is a machine used to cut, draw or otherwise shape material (especially metal) with dies, under pressure, or by heavy blows. Since a punch press is a power driven machine, the operator does not provide the mechanical force which shapes the material. Rather, the operator invokes a power driven mechanism disposed within the punch press by pushing a button or series of buttons or other actuation device in a predetermined manner.

Strictly speaking, a simple switch or push button would be sufficient to actuate the punch press, since all that is really needed is for an electric circuit to close and thereby invoke the power driven mechanism. However, it has been found that such simple actuation devices are unsafe because they make it too easy to accidentally actuate the punch press. For example, a hammer or other heavy object (i.e., something other than a human hand) could fall on the punch press push button and cause the punch press to actuate. Many individuals have lost their hands, arms, and even their lives due to an unexpected and accidental actuation of a punch press.

Therefore, safer actuation devices have been developed. For example, in one improvement, the operator is required to push two separate push buttons within a predetermined time frame. However, many operators are paid on a per-unit-of-production basis. Consequently, some operators have tried to defeat this safety mechanism in order to increase productivity, for example by using a 2×4 length of plywood to press both push buttons simultaneously. As might have been predicted, the operators' efforts to defeat this safety mechanism have unfortunately led to loss of life and limb. Thus, although two separate push buttons are safer than only one, an even safer approach is still needed.

Besides safety, another issue which has arisen is ergonomics. Again using punch presses as an example, the day-in and day-out operation of a punch press involves repetitively applying force to the punch press actuation device. Over time, this can lead to long term health problems such as cumulative trauma disorder and/or carpal tunnel syndrome. As a result, there is interest in providing an ergonomic actuation device which minimizes the potential for long term health problems associated with the long term repetitive usage of the actuation device.

A practical problem which has been encountered in providing an ergonomic actuation device is that an actuation device which is ergonomically correct in one orientation might be ergonomically incorrect in another orientation. Whether a device is ergonomic is largely determined by whether the motions required to use the device are natural or are strained. However, the motions required to use a device generally change depending on the orientation in which the device is installed. Thus, whether a device is ergonomic may depend on how it is installed. The ability to install a device in a variety of different orientations is known as freedom of installation, and the problem which has been encountered has been to provide an actuation device which has freedom of installation.

In short, what is needed is an actuation device with enhanced safety, ergonomic, and freedom of installation features. Specifically, the actuation device should have safety features which are difficult to defeat. Further, the actuation device should be ergonomic and thus minimize the potential for long term health problems associated with the long term repetitive usage of the actuation device. Finally, it should be possible to install the actuation device in a variety of different ergonomically correct orientations.

BRIEF SUMMARY OF THE INVENTION

A soft touch switch is presented. The soft touch switch according to the present invention comprises a switch housing, a first soft touch sensor, and a second soft touch sensor. The switch housing has an outer surface which is curved and an inner surface. The first sensor is disposed inside the switch housing adjacent a first portion of the inner surface, and the second sensor is disposed inside the switch housing adjacent a second portion of the inner surface. The first and second sensors are disposed in different planes inside the switch housing.

The soft touch switch can be implemented using any of a variety of soft touch sensor technologies. For example, the soft touch sensors can operate by generating an electric field and by then detecting the changes in the electric field caused when an operator places a hand near the soft touch sensor. Alternatively, other soft touch sensor technologies such as capacitive or infrared sensing could be used.

In an enhancement, the soft touch switch includes a timing circuit which ensures that the sensor pads are triggered within a predetermined time frame of each other. Thus, if one sensor pad is triggered, and then the other sensor pad is not triggered until much later, the timer circuit ensures that the soft touch switch is not actuated.

In another enhancement, the soft touch switch includes a power-up safety circuit which ensures that the soft touch switch can not turn on and be in an actuated state. Thus, the power-up safety circuit prevents an unexpected power-up condition from accidentally actuating the soft-touch switch. Both the timing circuit and the power-up safety circuit may be implemented using a microprocessor which is part of the sensor circuit associated with the soft touch sensors.

The soft touch switch has enhanced safety, ergonomic, and freedom of installation features. With respect to safety, the soft touch switch is difficult to defeat because, unlike conventional actuation devices used in industrial controls, the soft touch switch utilizes soft touch sensors and is not actuated by mechanical force. The soft touch switch is also difficult to defeat because of the shape of the housing in conjunction with the placement of the sensor pads in different planes. Taken in combination, these features make it extremely unlikely that the soft touch switch will be actuated by anything other than a human hand which is squarely placed on the housing of the soft touch switch. With respect to ergonomics, the use of soft touch sensors and the use of a curved housing also make the soft touch switch more ergonomic. Finally, with respect to freedom of installation, the soft touch switch can be installed in any plane and in any orientation and still provide a natural and therefore ergonomic actuation surface.

Other objects, features, and advantages of the present invention will become apparent to those skilled in the art from the following detailed description and accompanying drawings. It should be understood, however, that the detailed description and specific examples, while indicating preferred embodiments of the present invention, are given by way of illustration and not limitation. Many modifications and changes within the scope of the present invention may be made without departing from the spirit thereof, and the invention includes all such modifications.

BRIEF DESCRIPTION OF THE DRAWINGS

A preferred exemplary embodiment of the invention is illustrated in the accompanying drawings in which like reference numerals represent like parts throughout, and in which:

FIG. 1 illustrates a perspective view of an ergonomic soft touch palm button according to the present invention;

FIG. 2 illustrates a side cut-away view of an ergonomic soft touch palm button according to the present invention;

FIG. 3 illustrates a schematic diagram of a system incorporating an ergonomic soft touch palm button according to the present invention.

DETAILED DESCRIPTION OF THE PREFERRED EMBODIMENT

Figure 4:
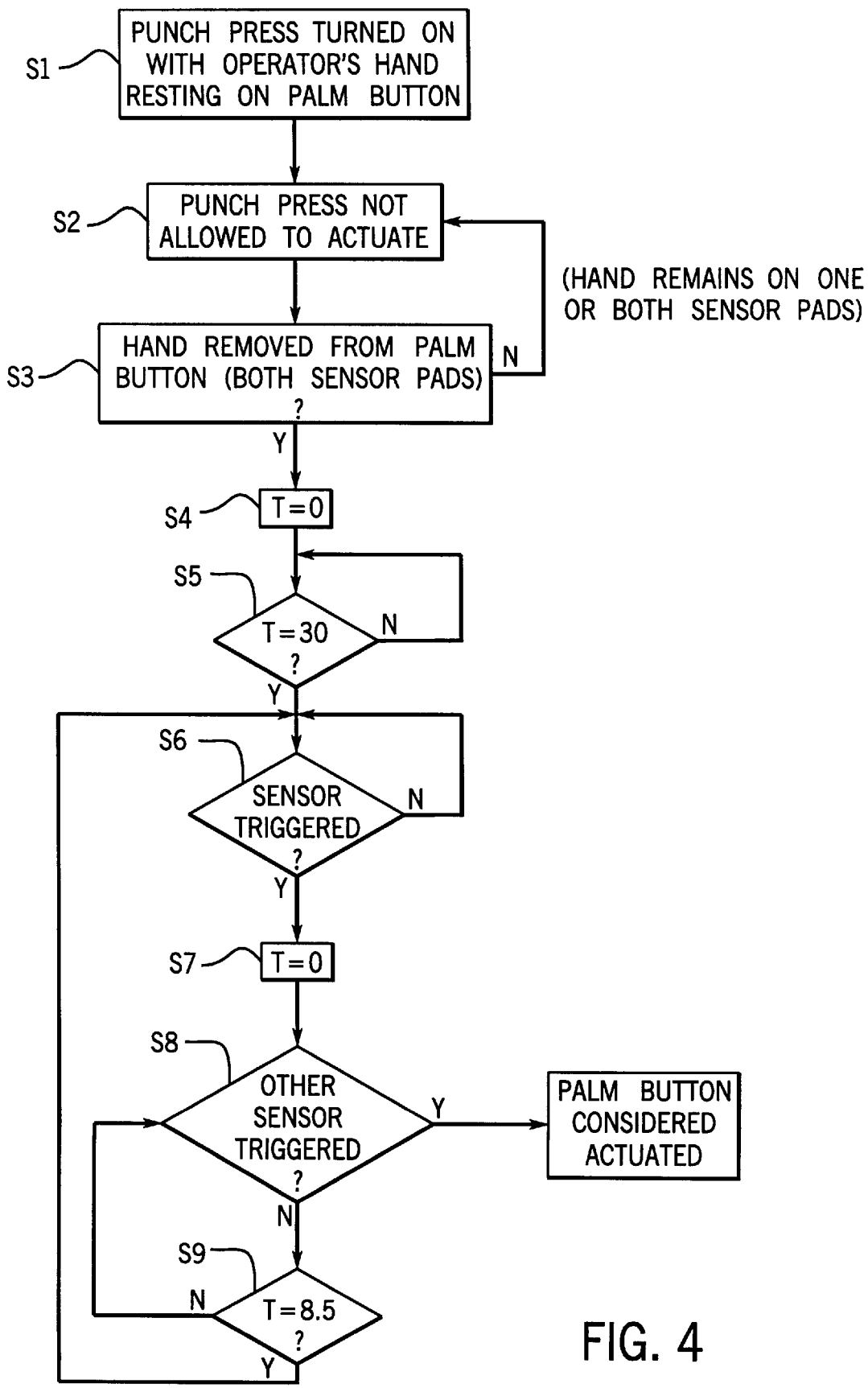
FIG. 4 illustrates the operation of a microprocessor used in a sensor circuit of an ergonomic soft touch palm button according to the present invention.

Referring now to FIGS. 1–3, an ergonomic soft touch switch or palm button 10 according to the present invention is illustrated.

The palm button 10 comprises a housing 12, left and right sensor pads 14a and 14b, a power supply 42, and a sensor circuit 44 which further includes a timer circuit 46 and a power-up safety circuit 48. The sensor pads 14a and 14b, the power supply 42 and the sensor circuit 44 are all disposed within the housing 12 and a metal enclosure 16.

The housing 12 has a top outer surface 18 which is curved (preferably in the shape of a partial sphere) and which is slightly larger than the size of a palm of a typical human hand. The housing 12 thus naturally conforms to the majority of hand profiles and provides an ergonomic actuation surface for the palm button 10. The housing 12 is made of a thermoplastic or other material which is resistant to chemicals commonly found in an industrial environment.

As most clearly illustrated in FIG. 2, which illustrates only the housing 12 and the sensor pads 14a and 14b, the left and right sensor pads 14a and 14b are disposed adjacent left and right inner portions 24a and 24b of an inner surface 22 of the housing 12. The sensor pads 14a and 14b are both generally flat and rectangular in shape, and are generally disposed in planes which are different from each other by an angle $2\alpha$.

The sensor pads 14a and 14b are soft touch sensor pads. Soft touch sensors are characterized in that they respond either to engagement in the form of proximity (e.g., of a user's limb) or to engagement in the form of slight physical contact. In the case of physical contact, the immediate purpose of the physical contact is usually to establish an electrical or thermal connection between the sensor pad and the user's skin, to interrupt or change an electrical or magnetic field, to interrupt or change transmission of a light or other type of beam, or some similar purpose, rather than to apply a mechanical force to an element of the sensor and thereby cause the element to move. Indeed, one of the advantages of soft touch sensors is that they ordinarily do not have any moving parts.

In the preferred embodiment, the sensor pads 14a and 14b each comprise a dielectric substrate (such as a glass material) and conductors 15 (such as a conductive ink) disposed on the dielectric substrate. The conductive material is used to create an electrostatic field which emanates above, below and through the dielectric substrate. To do this, the conductive material establishes a negatively charged region on the surface of the dielectric substrate and a positively charged ring which surrounds the negatively charged region, thereby creating the electrostatic field.

During operation of the sensor pads 14a and 14b, when a human hand is placed sufficiently close to one of the sensor pads, the electrostatic field surrounding the sensor pad is disturbed and capacitive energy is drawn from the sensor pad. (Preferably, the sensitivity of the sensor pads 14a and 14b is adjusted such that the user is required to touch the housing 12. As a result, the user is given tactile feedback as to whether they have triggered the sensor pads 14a and 14b.) The sensor circuit 44 detects the resultant changes in the electrostatic field, and thereby is able to detect the presence of the human hand. This soft touch sensor technology is preferred because the low impedance, low voltage circuits which are created are less susceptible to being triggered by non-human causes (such as humidity), and therefore more accurately sense only human touch.

Sensor pads which incorporate this technology are sold by TouchSensor Technologies, LLC, 201 North Gables Blvd., Wheaton Ill. 60187. Heretofore, this technology has been applied in the consumer appliance industry. No known use of this technology has been made in the field of industrial controls.

Of course, other soft touch sensor technologies could also be used to implement the present invention. For example, a capacitive touch sensor circuit could also be used. In a capacitive touch sensor circuit, the capacitance of a sensor circuit changes when a user touches a sensor pad, and the change in capacitance enables the user's touching to be detected. Examples of capacitive touch sensor circuits are disclosed in U.S. Pat. No. 5,239,152 entitled "Touch Sensor Panel With Hidden Graphic Mode" and in U.S. Pat. No. 5,153,572 entitled "Touch-Sensitive Control Circuit", both of which are hereby incorporated by reference. Infrared sensing could also be utilized.

In the illustrated embodiment, two sensor pads 14a and 14b are used. While additional sensor pads could be used, it has not been found that the use of additional sensor pads improves the operation of the palm button 10 sufficiently to justify the added cost and complexity. Further, in the illustrated embodiment, the two sensor pads 14a and 14b are flat. The sensor pads could instead be made curved, for example, so that they more closely conform to the shape of the housing 12 while still being disposed in different planes. Again, however, it is more difficult to manufacture curved sensor pads, and it has not been found that the use of curved sensor pads improves the operation of the palm button 10 sufficiently to justify the added cost.

Referring now also to FIG. 4, the sensor circuit 44 includes a microprocessor which preferably implements the following features. First, the microprocessor implements a power-up safety circuit 48. The power-up safety circuit 48 ensures that the palm button 10 can not turn on and be in an actuated state. In other words, assume that the power to the punch press 52 is turned off and that the operator's hand is nonchalantly resting on the palm button 10 (step S1). If the power comes back on while the operator's hand is still on the palm button 10, the power-up safety circuit 48 recognizes that the sensor pads 14*a* and 14*b* are already triggered and prevents the punch press 52 from being actuated (step S2). Accordingly, the operator's hand must first be removed (step S3), whereafter there is delay (e.g., thirty seconds) before the punch press 52 may be actuated (steps S4–S5). The power-up safety circuit 48 prevents the punch press 52 from accidentally being actuated upon an unexpected power-up.

Second, the microprocessor of the sensor circuit 44 implements a timer/monitor circuit 46 which ensures that the two sensor pads 14*a* and 14*b* are triggered within a predetermined time frame (e.g., milliseconds) of each other. Since the use of two sensor pads 14*a* and 14*b* provides redundancy, both sensor pads 14*a* and 14*b* must trigger nearly simultaneously in order for the palm button 10 to actuate. Thus, if one sensor pad is triggered (step S6), and then the other sensor pad is not triggered until 0.5 seconds later, the timer/monitor circuit 46 ensures that the punch press 52 is not actuated (steps S7–S9).

FIG. 3 illustrates a second palm button 54 used in conjunction with the palm button 10 and the punch press 52. The palm button 54 has curved sensor pads with non-parallel normals, as illustrated. As described above, the use of two actuation devices in conjunction with a punch press is known. In this case, the operator places a hand on the palm button 10, thereby triggering both sensor pads 14*a* and 14*b* and actuating the palm button 10. A similar sequence of events occurs with respect to the palm button 54. The outputs of the palm buttons 10 and 54 are fed to programmable logic controller interface 50 which, after ensuring that both palm buttons 10 and 54 have been actuated in a required manner, actuates the punch press 52.

Of course, the palm button 10 could also be used with other industrial machinery besides punch presses. For example, the palm button could be used for a motor starter or safety relay. Whether a single palm button is used or whether multiple palm buttons are used is determined based on the particular application.

The palm button 10 has numerous advantages over conventional actuation devices. First, the palm button 10 has safety features which are difficult to defeat. Unlike conventional actuation devices used in industrial controls, the palm button 10 is not actuated by mechanical force but rather utilizes soft touch sensors. Additionally, assuming the preferred soft touch sensor technology discussed above is used, the palm button 10 is sensitive to primarily only human touch and not, for example, to humidity or other factors found in an industrial environment. The range of objects which can trigger the sensor pads 14*a* and 14*b* is therefore very limited. For example, the sensor pads 14*a* and 14*b* would not be triggered in the event that a hammer or other heavy object fell on the palm button 10, unlike conventional push button actuation devices.

The shape of the housing 12 in conjunction with the placement of the two sensor pads 14*a* and 14*b* in different planes also makes the palm button 10 difficult to defeat. The use of two sensor pads 14*a* and 14*b* provides redundancy; both sensor pads 14*a* and 14*b* must be triggered in order to actuate the palm button 10. Further, the use of a curved housing and multi-plane pad placement makes it unlikely that a flat object will trigger both sensor pads 14*a* and 14*b*.

Thus, a human hand can conform to the housing 12 and therefore can trigger both sensor pads 14*a* and 14*b*. However, even assuming a flat object such as a 2×4 length of plywood could trigger one of the sensor pads 14*a* and 14*b* (which, as described above, are sensitive mainly to human touch), it would still not be able to simultaneously trigger both sensor pads. A flat and rigid object can not conform to the sensor housing 12 and therefore can not simultaneously trigger both sensor pads 14*a* and 14*b*. Moreover, if an object falls on the housing 12, the spherical shape of the housing 12 is likely to cause the object to immediately fall off the housing 12. Further, if a human hand only accidentally brushes against the housing 12, and is not placed squarely on the housing 12, then it is unlikely that both sensor pads 14*a* and 14*b* will trigger. In short, the palm button 10 is a very safe actuation device because it is extremely unlikely that the palm button 10 will be actuated by anything other than a human hand which is squarely placed on the housing 12.

Second, the palm button 10 is also ergonomic and thus minimizes the potential for long term health problems associated with long term repetitive usage of the palm button 10. The palm button 10 is actuated by the soft touch of the operator placing their hand on the palm button housing 12. No mechanical force is required to actuate the palm button 10; the palm button 10 does not have any moving parts. Rather, the mere presence of the operator's hand on the housing 12 actuates the palm button 10. Also, the shape of the housing 12 of the palm button 10 is spherical and thus provides a natural and ergonomic surface for the operator's hand to engage. The use of soft touch sensors and the use of a curved housing thus make the palm button not only safer but also more ergonomic.

Finally, it is possible to install the palm button 10 in a variety of different ergonomically correct orientations. If the palm button 10 is disposed parallel to the X-Y plane (see FIG. 1), such that the top outer surface 18 is facing upward, it is possible to rotate the palm button 10 about the Z-axis without ergonomic degradation. If the palm button 10 is disposed parallel to the Y-Z plane, such that the top outer surface 18 is facing to the left or to the right, it is possible to rotate the palm button 10 about the X-axis without ergonomic degradation. Finally, if the palm button 10 is disposed parallel to the X-Z plane, such that the top outer surface 18 is facing forward, it is possible to rotate the palm button 10 about the Y-axis without ergonomic degradation. Thus, no matter in which plane the palm button 10 is mounted, and no matter the orientation of the palm button 10 within that plane, the housing 12 provides a natural and therefore ergonomic actuation surface.

Many changes and modifications may be made to the present invention without departing from the spirit thereof. The scope of these and other changes will become apparent from the appended claims.

I claim:

1. A punch press comprising a soft touch switch, the actuation of said soft touch switch being necessary for said punch press to actuate, said soft touch switch further including a switch housing, said switch housing having an outer surface and an inner surface;

a first soft touch sensor, said first sensor being disposed inside said switch housing, and said first sensor having a first surface which is adjacent a first portion of said inner surface of said switch housing; and a second soft touch sensor, said second sensor being disposed inside said switch housing, said second soft touch sensor being capable of being triggered independently of said first soft touch sensor, and said second sensor having a second surface which is adjacent a second portion of said inner surface of said switch housing, said second surface having a normal which is non-parallel with a normal of said first surface;

a timer which establishes a predetermined time limit, wherein, once a first one of said first and second sensors is triggered, the second one of said first and second sensors must be triggered within said predetermined time limit in order to actuate said switch; and a monitor circuit which ensures that said switch does not actuate unless said second one of said first and second sensors is triggered within said predetermined time limit after said first one of said first and second sensors is triggered; and and wherein said switch housing is engageable by a single human hand such that said human hand substantially simultaneously triggers both said first and second sensors, and wherein both said first and second sensors must trigger in order for said switch to actuate.

2. The punch press according to claim 1, wherein said first and second surfaces are curved surfaces.

3. An industrial machine comprising a soft touch switch, said industrial machine being at least partially controlled by said soft touch switch, said soft touch switch further including a switch housing, said switch housing having a curved outer surface and an inner surface, a first soft touch sensor, said first sensor being disposed inside said switch housing adjacent a first portion of said inner surface; and a second soft touch sensor, said second sensor being disposed inside said switch housing adjacent a second portion of said inner surface, and said second soft touch sensor being capable of being triggered independently of said first soft touch sensor;

a timer which establishes a predetermined time limit, wherein, once a first one of said first and second sensors is triggered, the second one of said first and second sensors must be triggered within said predetermined time limit in order to actuate said switch; and a monitor circuit which ensures that said switch does not actuate unless said second one of said first and second sensors is triggered within said predetermined time limit after said first one of said first and second sensors is triggered; and wherein said switch housing is engageable by a single human hand such that said human hand substantially simultaneously triggers both said first and second sensors, and wherein both said first and second sensors must trigger in order for said switch to actuate.

4. The industrial machine according to claim 3, wherein said first sensor is disposed in a first plane, and wherein said second sensor is disposed in a second plane which is different than said first plane.

5. The industrial machine according to claim 3, wherein said first sensor includes a first conductor which generates a first electric field, and wherein said first sensor is triggered by changes detected in said first electric field;

wherein said second sensor includes a second conductor which generates a second electric field, and wherein said second sensor is triggered by changes detected in said second electric field.

6. The industrial machine according to claim 3, wherein said first and second sensors are capacitive soft touch sensors.

7. The industrial machine according to claim 3, wherein the soft touch switch further includes a power-up safety circuit, said power-up safety circuit preventing said soft touch switch from being actuated immediately upon power-up.

8. The industrial machine according to claim 3, wherein said outer surface is in the shape of a partial sphere.

9. The industrial machine according to claim 3, wherein the industrial machine is a punch press.

10. The industrial machine according to claim 3, wherein said first sensor has a first surface which is adjacent said first portion of said inner surface of said switch housing; and wherein said second sensor has a second surface which is adjacent a second portion of said inner surface of said switch housing, said second surface having a normal which is non-parallel with a normal of said first surface.

11. The industrial machine according to claim 10, wherein said first and second surfaces are curved surfaces.

12. The industrial machine according to claim 3, wherein said switch housing is a first switch housing, wherein said curved outer surface is a first curved outer surface, wherein said inner surface is a first curved inner surface, wherein the industrial machine further comprises a second soft touch switch, wherein both of said first and second soft touch switches must actuate in order for said industrial machine to actuate, and wherein the second soft touch switch further comprises a second switch housing, said second switch housing having a second curved outer surface and a second inner surface;

a third soft touch sensor, said third sensor being disposed inside said second switch housing adjacent a first portion of said second inner surface; and a fourth soft touch sensor, said fourth sensor being disposed inside said second switch housing adjacent a second portion of said second inner surface, and said fourth sensor being capable of being triggered independently of said third sensor; and wherein said second switch housing is engageable by an additional single human hand such that said additional human hand substantially simultaneously triggers both said third and fourth sensors, and wherein both said third and fourth sensors must trigger in order for said second switch to actuate.

13. The industrial machine according to claim 3, wherein said predetermined time limit is on the order of milliseconds in length.

14. An industrial machine comprising a soft touch switch, said industrial machine being at least partially controlled by said soft touch switch, soft touch switch further including a switch housing, said switch housing having a curved outer surface and an inner surface;

a first soft touch sensor, said first sensor being disposed inside said switch housing, and said first sensor having a first surface which is adjacent a first portion of said inner surface of said switch housing;

a second soft touch sensor, said second sensor being disposed inside said switch housing, and said second sensor having a second surface which is adjacent a second portion of said inner surface of said switch housing, said second surface having a normal which is non-parallel with a normal of said first surface;

a power-up safety circuit, said power-up safety circuit preventing said soft touch switch from being actuated immediately upon power-up;

a timer which establishes a predetermined time limit, wherein, once a first one of said first and second sensors is triggered, the second one of said first and second sensors must be triggered within said predetermined time limit in order to actuate said switch;

a monitor circuit which ensures that said switch does not actuate unless said second one of said first and second sensors is triggered within said predetermined time limit after said first one of said first and second sensors is triggered;

and wherein said switch housing is engageable by a single human hand such that said human hand substantially simultaneously triggers both said first and second sensors, and wherein both said first and second sensors must trigger in order for said switch to actuate.

15. The industrial machine according to claim 14,
wherein said first sensor includes a first conductor which generates a first electric field, and wherein said first sensor is triggered by changes detected in said first electric field;

wherein said second sensor includes a second conductor which generates a second electric field, and wherein said second sensor is triggered by changes detected in said second electric field.

16. The industrial machine according to claim 14, wherein said first and second sensors are capacitive soft touch sensors.

17. The industrial machine according to claim 14, wherein said outer surface is in the shape of a partial sphere.

18. The industrial machine according to claim 14, wherein said timer, said monitor circuit, and said power-up safety circuit are all both implemented using a microprocessor.

19. The industrial machine according to claim 14, wherein the industrial machine is a punch press.

20. The industrial machine according to claim 14, wherein said predetermined time limit is on the order of milliseconds in length.

21. An industrial machine comprising:
(A) a first soft touch switch, said first soft touch switch further including
  (1) a first switch housing, said first switch housing having a first outer surface, said first outer surface being curved and being approximately the size of a palm of a human hand, and said first switch housing having a first inner surface which is disposed inside said switch housing adjacent said first outer surface,
  (2) a first soft touch sensor, said first sensor (a) being disposed inside said first switch housing adjacent a first portion of said first inner surface and (b) being triggerable by engagement of said first sensor by a first portion of a first palm of a first human hand, and
  (3) a second soft touch sensor, said second sensor being capable of being triggered independently of said first sensor, and said second sensor (a) being disposed inside said first switch housing adjacent a second portion of said first inner surface and (b) being triggerable by engagement of said second sensor by a second portion of the first palm of the first human hand, such that said first and second sensors are capable of being substantially simultaneously triggered by said first human hand, and
  (4) a first timer which establishes a first predetermined time limit, wherein, once a first one of said first and second sensors is triggered, the second one of said first and second sensors must be triggered within said first predetermined time limit in order to actuate said first switch, and
  (5) a first monitor circuit which ensures that said first switch does not actuate unless said second one of said first and second sensors is triggered within said predetermined time limit after said first one of said first and second sensors is triggered; and
wherein both said first and second sensors must trigger in order for said first switch to actuate;
(B) a second soft touch switch, said second soft touch switch being capable of being actuated independently of said first soft touch switch, and said second soft touch switch further including
  (1) a second switch housing, said second switch housing having a second outer surface, said second outer surface being curved and being approximately the size of a palm of a human hand, and said second switch housing having a second inner surface which is disposed inside said switch housing adjacent said second outer surface,
  (2) a third soft touch sensor, said third sensor (a) being disposed inside said second switch housing adjacent a first portion of said second inner surface and (b) being triggerable by engagement of said third sensor by a first portion of a second palm of a second human hand, and
  (3) a fourth soft touch sensor, said fourth sensor being capable of being triggered independently of said third sensor, and said fourth sensor (a) being disposed inside said second switch housing adjacent a second portion of said second inner surface and (b) being triggerable by engagement of said fourth sensor by a second portion of the second palm of the second human hand, such that said third and fourth sensors are capable of being substantially simultaneously triggered by said second human hand, and
  (4) a second timer which establishes a second predetermined time limit, wherein, once a first one of said third and fourth sensors is triggered, the second one of said third and fourth sensors must be triggered within said first predetermined time limit in order to actuate said second switch, and
  (5) a second monitor circuit which ensures that said second switch does not actuate unless said second one of said third and fourth sensors is triggered within said predetermined time limit after said first one of said third and fourth sensors is triggered; and
wherein both said third and fourth sensors must trigger in order for said second switch to actuate;
(C) a controller, said controller controlling actuation of said industrial machine, said controller causing said industrial machine to actuate only when said first, second, third and fourth sensors are triggered and said first and second soft touch switches actuate in a predetermined manner.

22. The industrial machine according to claim 21, wherein said first and second outer surfaces are both in the shape of a partial sphere.

* * * * *